(12) United States Patent
Hu

(10) Patent No.: US 12,009,369 B2
(45) Date of Patent: Jun. 11, 2024

(54) DISPLAY PANEL AND DISPLAY DEVICE

(71) Applicant: TCL CHINA STAR OPTOELECTRONICS TECHNOLOGY CO., LTD., Guangdong (CN)

(72) Inventor: Daobing Hu, Guangdong (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 513 days.

(21) Appl. No.: 17/423,956

(22) PCT Filed: May 24, 2021

(86) PCT No.: PCT/CN2021/095452
§ 371 (c)(1),
(2) Date: Jul. 19, 2021

(87) PCT Pub. No.: WO2022/227150
PCT Pub. Date: Nov. 3, 2022

(65) Prior Publication Data
US 2022/0352209 A1  Nov. 3, 2022

(30) Foreign Application Priority Data
Apr. 29, 2021 (CN) .......................... 202110473830.6

(51) Int. Cl.
*H01L 33/38* (2010.01)
*H01L 27/12* (2006.01)
*H01L 29/16* (2006.01)
*H01L 29/20* (2006.01)

(52) U.S. Cl.
CPC ........ *H01L 27/124* (2013.01); *H01L 29/1608* (2013.01); *H01L 29/2003* (2013.01)

(58) Field of Classification Search
CPC ............... H01L 27/124; H01L 29/1608; H01L 29/2003; H01L 29/78684
See application file for complete search history.

(56) References Cited

U.S. PATENT DOCUMENTS

2007/0200991 A1* 8/2007 Chae ................. G02F 1/134363
349/139
2016/0197131 A1 7/2016 Park

FOREIGN PATENT DOCUMENTS

| CN | 1870284 A | 11/2006 |
| CN | 101424841 A | 5/2009 |
| CN | 201314993 Y * | 9/2009 |

(Continued)

*Primary Examiner* — Samuel Park
(74) *Attorney, Agent, or Firm* — The Roy Gross Law Firm, LLC; Roy Gross

(57) ABSTRACT

A display panel and a display device are provided. A sub-pixel unit of the display panel includes at least one light-transmitting region, and each light-transmitting region is provided with at least one driving transistor. At least part of a source wiring of the driving transistor is disposed at a boundary of the light-transmitting region and parallel to an extension direction of data signal lines, and a drain wiring is disposed in the light-transmitting region. The light-transmitting region of the sub-pixel unit occupied by the driving transistor is reduced to alleviate a problem of low aperture ratio of a backplane of current display products.

16 Claims, 6 Drawing Sheets

(56) References Cited

FOREIGN PATENT DOCUMENTS

| | | | | |
|---|---|---|---|---|
| CN | 103137616 | A | 6/2013 | |
| CN | 103946741 | A | 7/2014 | |
| CN | 104656333 | A | 5/2015 | |
| CN | 107665909 | A | 2/2018 | |
| CN | 108646476 | A * | 10/2018 | ....... G02F 1/136259 |
| CN | 109449182 | A | 3/2019 | |
| CN | 111009532 | A | 4/2020 | |
| CN | 111552132 | A | 8/2020 | |
| JP | 2005223254 | A | 8/2005 | |
| JP | 2006308862 | A | 11/2006 | |
| JP | 2008083677 | A | 4/2008 | |
| JP | 2010243939 | A | 10/2010 | |

\* cited by examiner

DISPLAY PANEL AND DISPLAY DEVICE

FIELD OF INVENTION

This application relates to a field of display technology, and in particular to a display panel and a display device.

BACKGROUND OF INVENTION

With continuous development of display technology, people have higher requirements for the display technology of new display products. Especially in large-size high-end display products with 8K resolution, etc., a resolution has been increasing, so number of pixels has increased accordingly, and because sizes of the pixels are getting smaller, number of thin film transistors (TFTs) in the pixels also increases. Current traditional TFT design needs to reserve a specific TFT region in the pixels to fabricate TFTs, and the TFT region is opaque. In such a design, as a resolution of display products continues to increase, the number of TFTs is also increasing, which will inevitably lead to TFTs occupying more space on a backplane. As a result, an aperture ratio of the backplane is reduced, which cannot meet a demand for high-resolution displays. Therefore, it is necessary to solve a technical problem of low aperture ratio of the backplane of current display products.

Technical Problem

The present application provides a display panel and a display device to alleviate a technical problem of low aperture ratio of the backplane of the current display products.

SUMMARY OF INVENTION

In order to solve the above problem, the technical solutions provided by this application are as follows:

An embodiment of the present application provides a display panel, which includes gate scan lines extending along a first direction and data signal lines extending along a second direction, and the data signal lines intersect the gate scan lines to define a plurality of sub-pixel units, wherein each of the sub-pixel units includes at least one light-transmitting region, each of the light-transmitting regions is provided with at least one driving transistor. The driving transistor includes a source wiring and a drain wiring. Wherein, at least part of the source wiring of the driving transistor is disposed at a boundary of the light-transmitting region and parallel to an extension direction of the data signal lines, and the drain wiring is disposed in the light-transmitting region.

In the display panel provided by an embodiment of the present application, the drain wiring is parallel to the second direction, and the drain wiring coincides with a centerline of the light-transmitting region.

In the display panel provided by the embodiment of the present application, the source wiring includes two first sub-source lines disposed at the boundary of the light-transmitting region and parallel to the extension direction of the data signal lines and a second sub-source line connecting the two first sub-source lines, wherein the two first sub-source lines are symmetrical with respect to the drain wiring.

In the display panel provided by the embodiment of the present application, the second sub-source line is parallel to the first direction, and the second sub-source line coincides with a dividing line of two adjacent light-transmitting regions.

In the display panel provided by the embodiment of the present application, one of the two first sub-source lines is electrically connected to an adjacent one of the data signal lines.

In the display panel provided by the embodiment of the present application, an interval between the first sub-source line and the adjacent one of the data signal lines is less than or equal to 1.5 micrometers.

In the display panel provided by the embodiment of the present application, the source wiring includes a first sub-source line and a second sub-source line, the first sub-source line is disposed at the boundary of the light-transmitting region and parallel to the extension direction of the data signal lines, one end of the second sub-source line is connected to the first sub-source line, and the other end of the second sub-source line is connected to one of the data signal lines far away from the first sub-source line.

In the display panel provided by the embodiment of the present application, a line width of the source wiring and/or a line width of the drain wiring are/is greater than or equal to 1.5 micrometers.

In the display panel provided by the embodiment of the present application, the driving transistor further includes a gate disposed on the same layer as the gate scan lines and connected to one of the gate scan lines, and the gate is disposed corresponding to the light-transmitting region.

In the display panel provided by the embodiment of the present application, a material of the gate includes indium tin oxide.

In the display panel provided by the embodiment of the present application, the driving transistor further includes an active layer disposed opposite to the gate.

In the display panel provided by the embodiment of the present application, the active layer includes a channel region and a doped region, a portion of the active layer corresponding to the channel region overlaps the gate in a vertical direction, and a portion of the active layer corresponding to the doped region is connected to the source wiring and the drain wiring.

In the display panel provided by the embodiment of the present application, a material of the active layer includes silicon carbide and gallium nitride.

An embodiment of the present application further provides a display device, which includes a display panel, and the display panel includes: gate scan lines extending along a first direction; data signal lines extending along a second direction, and the data signal lines intersect the gate scan lines to define a plurality of sub-pixel units, wherein each of the sub-pixel units includes at least one light-transmitting region, each of the light-transmitting regions is provided with at least one driving transistor, and the driving transistor includes a source wiring and a drain wiring; and wherein, at least part of the source wiring of the driving transistor is disposed at a boundary of the light-transmitting region and parallel to an extension direction of the data signal lines, and the drain wiring is disposed in the light-transmitting region.

In the display device provided by the embodiment of the present application, the drain wiring is parallel to the second direction, and the drain wiring coincides with a centerline of the light-transmitting region.

In the display device provided by the embodiment of the present application, the source wiring includes two first sub-source lines disposed at the boundary of the light-transmitting region and parallel to the extension direction of the data signal lines and a second sub-source line connecting the two first sub-source lines, wherein the two first sub-source lines are symmetrical with respect to the drain wiring.

In the display device provided by the embodiment of the present application, the second sub-source line is parallel to the first direction, and the second sub-source line coincides with a dividing line of two adjacent light-transmitting regions.

In the display device provided by the embodiment of the present application, one of the two first sub-source lines is electrically connected to one of the data signal lines adjacent to thereof.

In the display device provided by the embodiment of the present application, an interval between the first sub-source line and the adjacent one of the data signal lines is less than or equal to 1.5 micrometers.

In the display device provided by the embodiment of the present application, the source wiring includes a first sub-source line and a second sub-source line, the first sub-source line is disposed at the boundary of the light-transmitting region and parallel to the extension direction of the data signal lines, one end of the second sub-source line is connected to the first sub-source line, and the other end of the second sub-source line is connected to one of the data signal lines far away from the first sub-source line.

Advantageous Effect

In the display panel and the display device provided by this application, a source wiring of a driving transistor in a sub-pixel unit includes two first sub-source lines disposed at a boundary region of the sub-pixel unit and parallel to a second direction and a second sub-source line arranged parallel to a first direction. The two first sub-source lines are connected by the second sub-source line. A drain wiring of the driving transistor is disposed at a light-transmitting region so that entire driving transistor is designed in a harpoon shape. The boundary region of the sub-pixel unit is not used for display, so designing the source wiring of the driving transistor at the boundary region will not affect the display of the sub-pixel unit. Furthermore, it is not necessary to provide a separate driving transistor disposing region, so that an area of the light-transmitting region of the pixel unit occupied by driving transistor is reduced, the area of the light-transmitting region of the pixel unit is increased, and an aperture ratio of a backplane of a display product is improved.

DESCRIPTION OF DRAWINGS

In order to describe the technical solutions more clearly in the embodiments of the present application, following will briefly introduce the drawings that need to be used in the description of the embodiments. Obviously, the drawings in the description are only some embodiments of the application. For those skilled in the art, other drawings can be obtained based on these drawings without creative work.

DETAILED DESCRIPTION OF PREFERRED EMBODIMENTS

Figure 1:
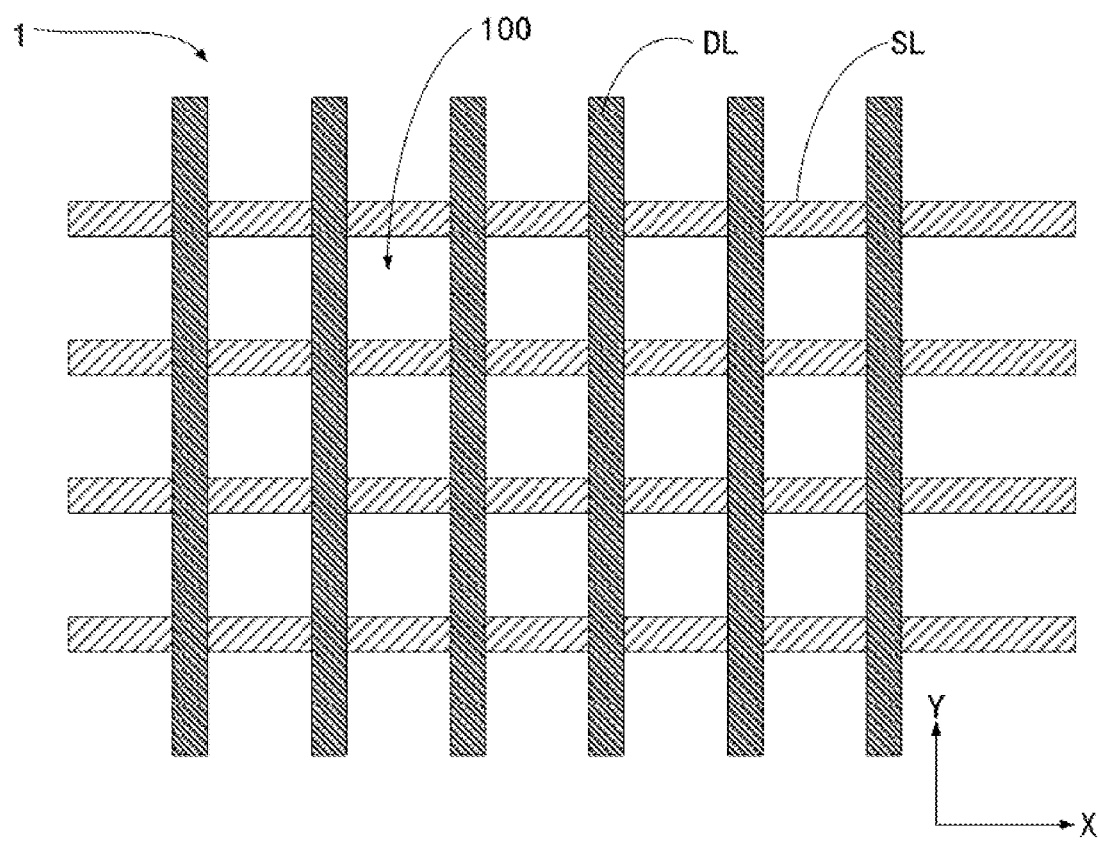
FIG. 1 is a schematic diagram of a top view structure of a display panel provided by an embodiment of the application.

The description of following embodiments refers to attached drawings to illustrate specific embodiments that can be implemented in the present application. Directional terms mentioned in this application, such as "upper", "lower", "front", "behind", "left", "right", "inside", "outside", "side", etc., are merely referred to the direction of the drawings. Therefore, the directional terminology is for the purpose of illustration and understanding of the application rather than to limit the application. In the drawings, structurally similar elements are denoted by the same reference numerals. In the drawings, for clear understanding and ease of description, the thickness of some layers and regions are exaggerated. That is, the size and thickness of each component shown in the drawings are arbitrarily shown, but this application is not limited thereto.

Figure 2:
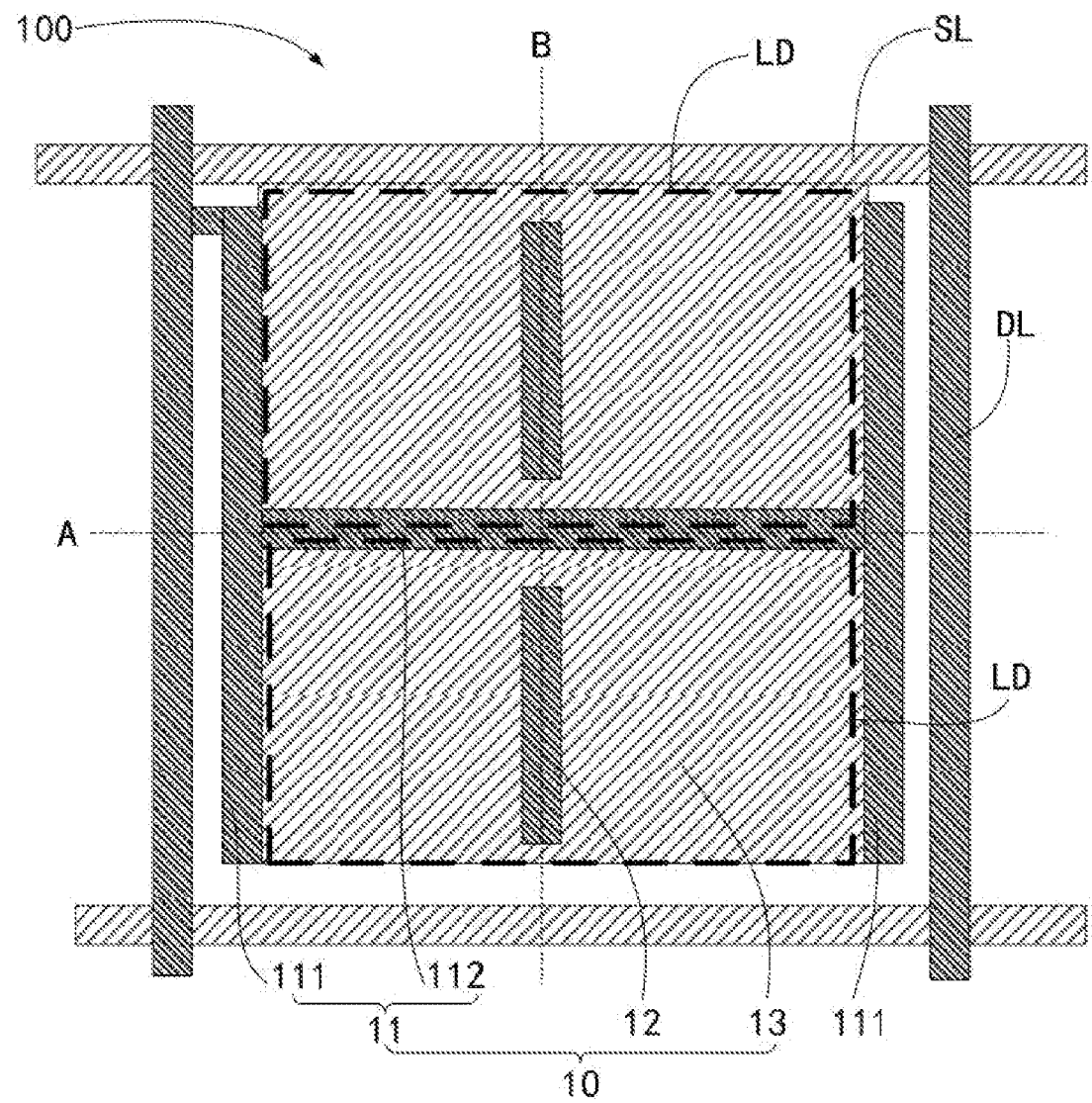
FIG. 2 is a schematic diagram of a top view structure of a sub-pixel unit in FIG. 1.

Please refer to FIG. 1 and FIG. 2 together. FIG. 1 is a schematic top view of a display panel provided by an embodiment of the application, and FIG. 2 is a schematic top view of a sub-pixel unit in FIG. 1. The display panel 1 includes gate scan lines SL extending along a first direction X and data signal lines DL extending along a second direction Y, the data signal lines DL and the gate scan lines SL are insulated from each other, and the data signal lines DL intersect the gate scan lines SL to define a plurality of sub-pixel units 100. Optionally, at least three sub-pixel units 100 form one pixel unit, for example, the three sub-pixel units 100 are red sub-pixel, green sub-pixel, and blue sub-pixel, respectively. The three primary colors of red, green, and blue are used to realize color display.

Optionally, the data signal lines DL are located above the gate scan lines SL, and the data signal lines DL and the gate scan lines SL are separated by an insulating layer. However, the present application is not limited to this, and the present application does not limit the vertical positional relationship between the data signal lines DL and the gate scan lines SL. In the embodiment of the present application "the data signal lines DL are located above the gate scan lines SL" is taken as an example for description.

Further, the projection of the data signal lines DL and the gate scan lines SL in the vertical direction forms an included angle. Correspondingly, the first direction X and the second direction Y also form an included angle. Optionally, the first direction X refers to a horizontal direction, and the second direction Y refers to a vertical direction. In this situation, the included angle formed by the first direction X and the second direction Y is 90 degrees, which can simplify a manufacturing process of display panel 1.

The data signal lines DL intersect the gate scan lines SL to define a plurality of sub-pixel units 100. The sub-pixel unit 100 includes at least one light-transmitting region LD, and each of the light-transmitting region LD is provided with at least one driving transistor 10, and the driving transistor 10 includes a source wiring 11 and a drain wiring 12. At least part of the source wiring 11 of the driving transistor 10 is disposed at a boundary of the light-transmitting region LD and parallel to an extension direction of the data signal lines DL, and the drain wiring 12 is disposed in the light-transmitting region LD.

In the embodiment of the present application, take "the sub-pixel unit 100 includes two light-transmitting regions LD, and each of the light-transmitting regions LD is provided with one driving transistor 10" as an example for illustration.

Specifically, the source wirings 11 of the driving transistors 10 in the two light-transmitting regions LD are integrally arranged. The source wiring 11 includes two first sub-source lines 111 disposed at the boundary of the light-transmitting region LD and parallel to the second direction Y and a second sub-source line 112 disposed parallel to the first direction X, wherein the two first sub-source lines 111 are connected by the second sub-source line 112. The two first sub-source lines 111 are disposed at the boundary of the light-transmitting region LD. The boundary of the light-transmitting region LD is usually provided with signal shielding lines, so the boundary region is not used for display. The first sub-source line 111 is disposed at the boundary region and does not affect the display of the sub-pixel unit 100.

Further, the two first sub-source lines 111 are parallel to each other and are respectively close to their corresponding data signal line DL. The corresponding data signal line DL refers to the data signal line DL adjacent to the first sub-source line 111, that is, the data signal line DL closest to each of the first sub-source lines 111. There is an interval between the first sub-source line 111 and the corresponding data signal line DL. The distance of the interval is related to the process conditions used. Considering the process capability and the coupling between different signals, the distance of the interval can be about 1.5 micrometers. Optionally, the interval distance is less than or equal to 1.5 micrometers. When the interval distance is small, the pixel space occupied by the first sub-source line 111 and the data signal line DL can be reduced, thereby increasing the light-transmitting region of the sub-pixel unit 100. However, in order to prevent the coupling between the first sub-source line 111 and adjacent data signal line DL, the interval distance cannot be too small. For example, the interval distances between the two first sub-source lines 111 and the corresponding data signal line DL are about 1.5 micrometers.

It should be noted that the driving transistor 10 includes two first sub-source lines 111, one of the two first sub-source lines 111 is electrically connected to the adjacent data signal line DL, and the other one of the first sub-source lines 111 is not electrically connected to the adjacent data signal line DL. When the distance between the unconnected first sub-source line 111 and the adjacent data signal line DL is relatively close, signal coupling may occur.

Because the two first sub-source lines 111 are electrically connected through the second sub-source line 112, the data signal line DL that provides drive signal to the driving transistor 10 transmits the drive signal to another first sub-source line 111 through the first sub-source line 111 and the second sub-source line 112 electrically connected to the data signal line DL. The drive signal provided by the data signal line DL that provides the drive signal to the driving transistor 10 may be different from the drive signal provided by the adjacent data signal line DL. The signal lines that provide different signals may be coupled when the distance is relatively close, so that the first sub-source lines 111 that are not connected to each other and the adjacent data signal line DL may be coupled.

Figure 3:
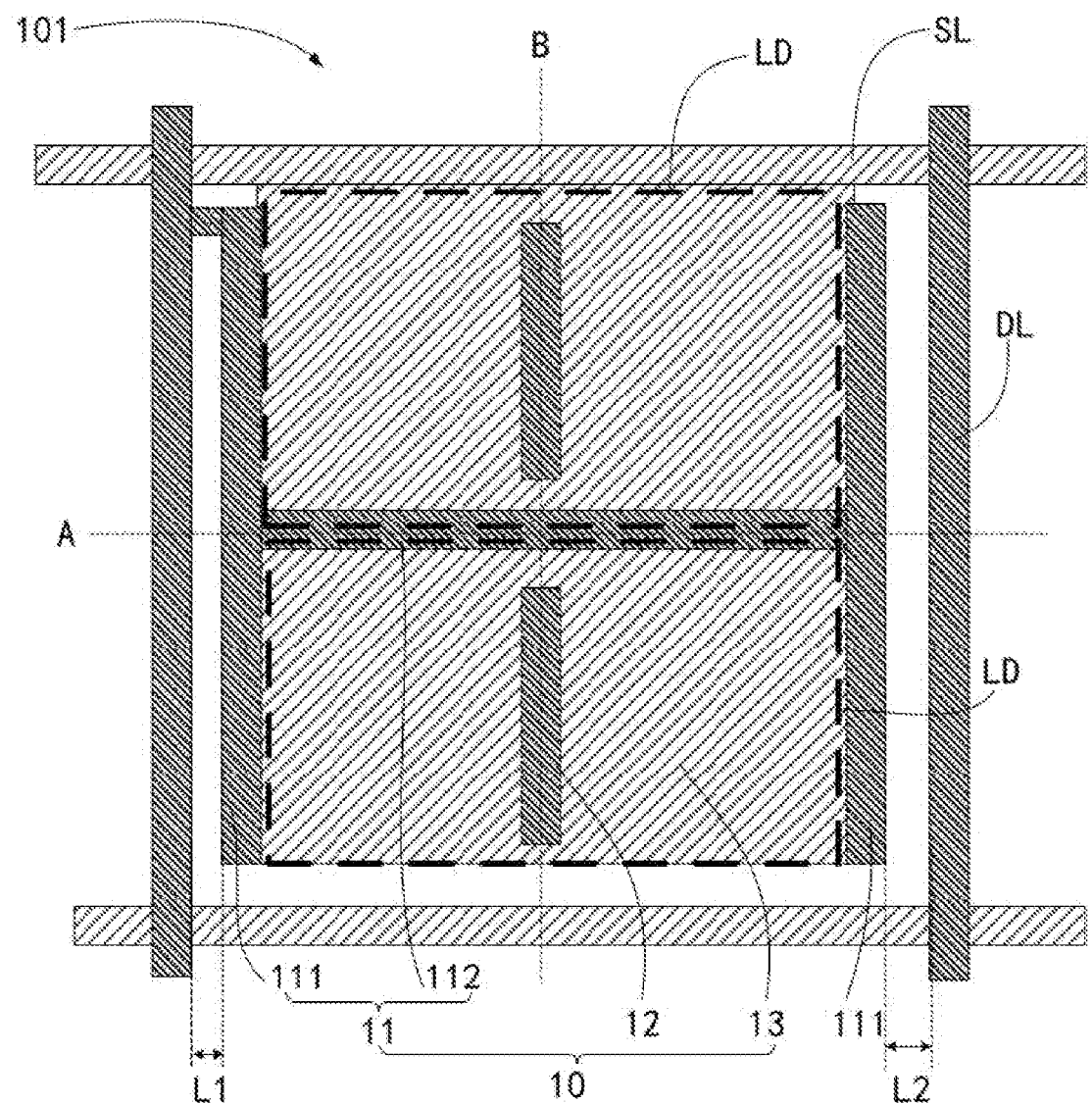
FIG. 3 is a schematic diagram of another top view structure of a sub-pixel unit provided by an embodiment of the application.

Optionally, please refer to FIG. 3, which is a schematic diagram of another top-view structure of the sub-pixel unit provided by an embodiment of the application. In order not to occupy too much pixel space and prevent coupling between signal lines, the interval distances between the two first sub-source lines 111 of the sub-pixel unit 101 and the corresponding data signal line DL may be different. The interval distance L1 between the first sub-source line 111 and the data signal line DL that is electrically connected to each other is smaller than the interval distance L2 between the first sub-source line 111 and the data signal line DL that is not electrically connected to each other. Optionally, the interval distance L1 between the first sub-source line 111 and the data signal line DL that is electrically connected to each other is less than 1.5 micrometers, and the interval distance L2 between the first sub-source line 111 and the data signal line DL that is not electrically connected to each other is greater than 1.5 micrometers.

The two first sub-source lines 111 and the second sub-source line 112 encircle a square structure with an opening at one end, the drain wiring 12 is disposed in the opening, so that the whole driving transistor 10 is designed in a harpoon shape. The second sub-source line 112 is arranged parallel to the first direction X, that is, the second sub-source line 112 is arranged parallel to the gate scan line SL.

Specifically, the second sub-source line 112 coincides with a dividing line A of the two adjacent light-transmitting regions LD. The areas of the two adjacent light-transmitting regions LD may be equal or unequal. When the areas of the two light-transmitting regions LD are equal, the two light-transmitting regions LD are symmetrical with respect to the second sub-source line 112. The dividing line A between the two light-transmitting regions LD refers to the area at the junction of the two light-transmitting regions LD, and is not an actual line.

Figure 4:
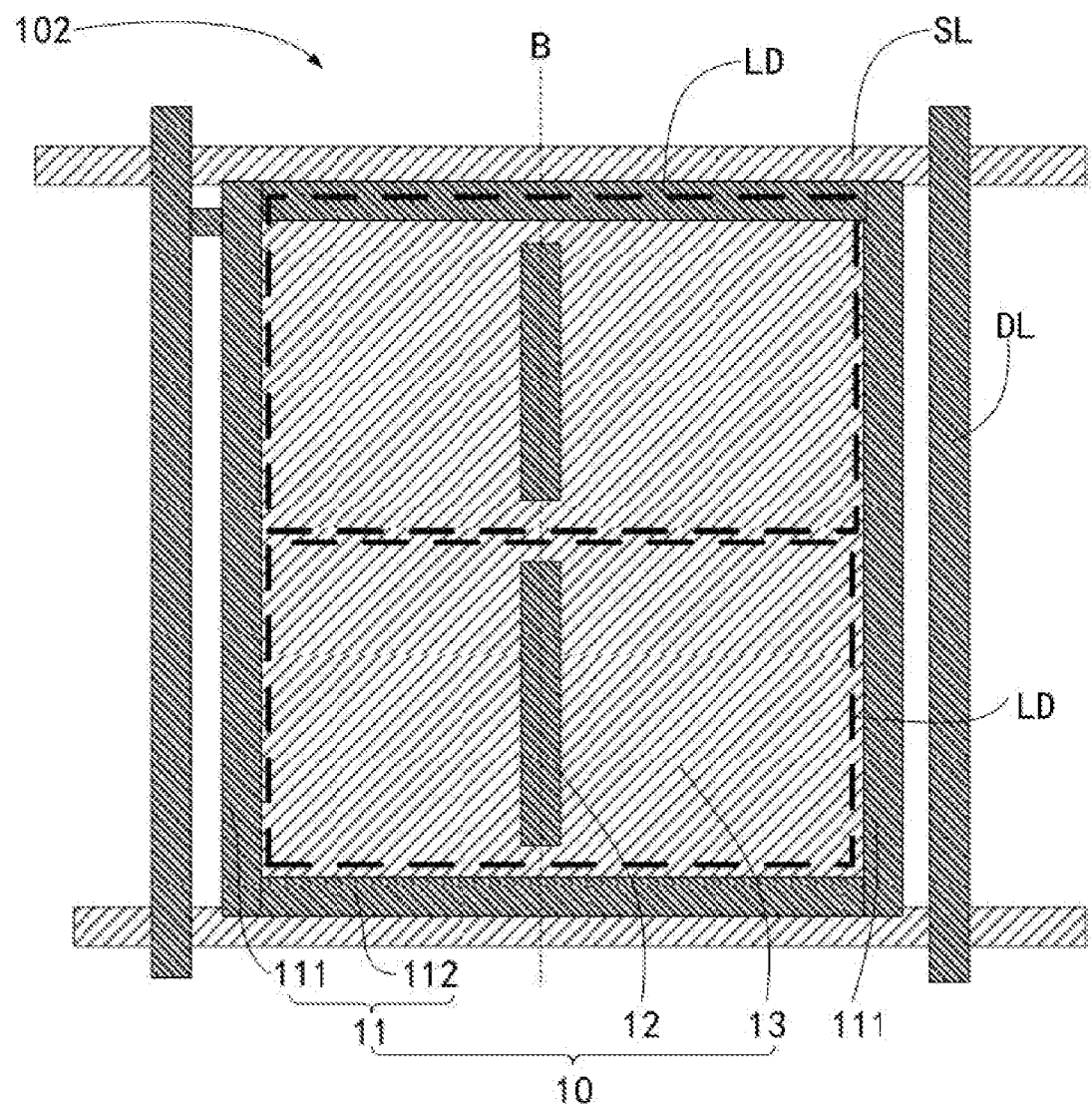
FIG. 4 is a schematic diagram of yet another top view structure of a sub-pixel unit provided by an embodiment of the application.

Optionally, please refer to FIG. 4, which is a schematic diagram of yet another top-view structure of the sub-pixel unit provided by an embodiment of the application. The second sub-source line 112 of the sub-pixel unit 102 is disposed at the other boundary of the light-transmitting region LD, the other boundary refers to the boundary formed by the gate scan line SL. In this way, the second sub-source line 112 is close to the gate scan line SL.

Optionally, the projections of the second sub-source line 112 and the gate scan line SL in the vertical direction at least partially overlap. In this way, when the boundary region also needs to be provided with shielding signal lines that cannot be used for display, arranging the second sub-source line 112 in this region can further reduce the pixel space occupied by the driving transistor 10.

Please refer to FIG. 1 and FIG. 2 together, the drain wiring 12 is disposed in the opening formed by the source wiring 11. The drain wiring 12 is parallel to the second direction Y, and the drain wiring 12 coincides with the centerline B of the light-transmitting region LD. In this way, when the interval distances between the two first sub-source lines and the adjacent data signal lines DL are the same, the two first sub-source lines 111 are symmetrical with respect to the drain wiring 12.

It should be noted that the centerline B of the light-transmitting region LD refers to a virtual line parallel to the second direction Y and dividing the light-transmitting region LD into two halves. Generally, the pixel structure in each light-transmitting region LD is divided into multiple domains, for example, the pixel structure can be divided into two domain regions by a main electrode. The two domain regions are symmetrical with respect to the main electrode, and the display effect of the region corresponding to the main electrode is generally not good, and dark lines may appear. The drain wiring 12 is arranged corresponding to the region of the main electrode, which can reduce the influence on the display effect of the display product.

Certainly, this application is not limited to this. The drain wiring 12 of the present application may also be arranged at a certain angle with the second direction Y or the drain wiring 12 may be parallel to the second direction Y but it is not located in the middle of the two first sub-source lines 111.

Optionally, the line widths of the source wiring 11 and the drain wiring 12 are both equal to the line width of the data signal line DL, which can simplify the manufacturing process. In addition, in order to prevent wire breakage caused by overly small line width and increase of shading area caused by overly large line width, the line width of the source wiring 11, the drain wiring 12, and the data signal line DL may be set at about 1.5 micrometers. Optionally, the line width is greater than or equal to 1.5 micrometers. Certainly, the present application is not limited to this, and the line widths of the source wiring 11, the drain wiring 12, and the data signal line DL in the embodiment of the present application may also be unequal.

It should be noted that the wiring connected to the data signal line DL in this application is not limited to the source wiring. The wiring connected to the data signal line DL may also be a drain wiring, and this application only uses the connection of the source wiring 11 and the data signal line DL as a schematic illustration. Because the polarity of the source wiring 11 and the drain wiring 12 is related to the high and low potential of the voltage, it is not related to whether it is connected to the data signal line DL. When the end connected to the data signal line DL is at a high potential, it is a drain wiring, and when the end connected to the data signal line DL is at a low potential, it is a source wiring.

In the following, other structures of the driving transistor 10, such as a gate, and an active layer, etc., will be explained.

Figure 5:
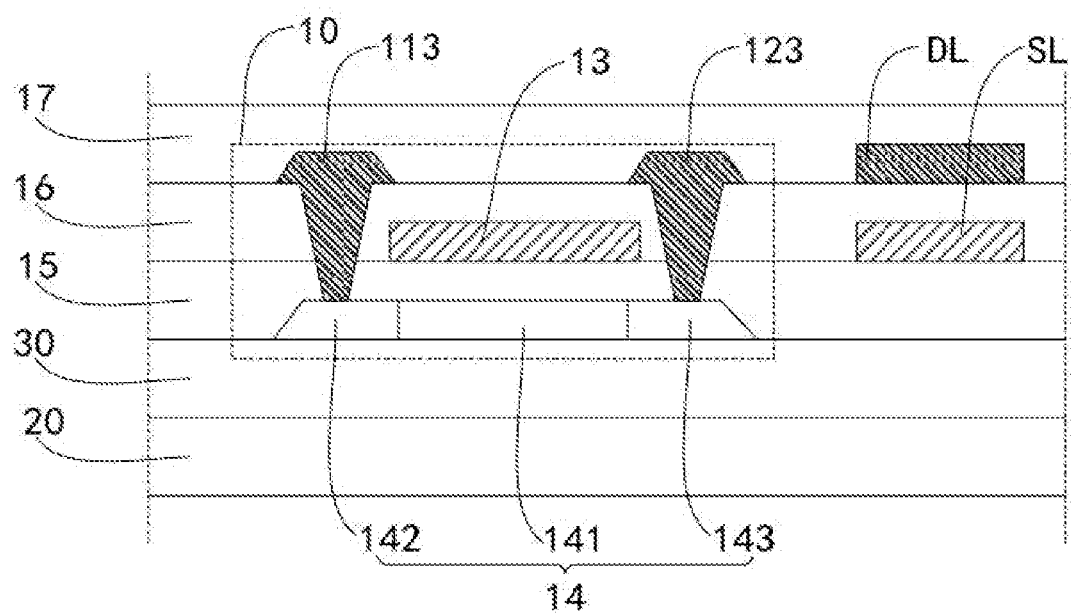
FIG. 5 is a schematic diagram of a cross-sectional structure of a driving transistor provided by an embodiment of the application.

Please refer to FIG. 2 and FIG. 5 together. FIG. 5 is a schematic cross-sectional structure diagram of a driving transistor provided by an embodiment of the application. Specifically, the driving transistor 10 further includes a gate 13 provided on the same layer as the gate scan line SL and connected to each other, and the gate 13 corresponds to the light-transmitting region LD. The gate 13 is connected to a corresponding gate scan line SL. Optionally, the gate 13 and the corresponding gate scan line SL are integrally arranged.

Optionally, the material of the gate 13 includes transparent conductive materials such as indium tin oxide (ITO). The gate 13 corresponds to the light-transmitting region LD and is made of a transparent conductive material, which does not affect the light transmittance of the light-transmitting region LD, that is, it does not occupy the area of the light-transmitting region of the sub-pixel unit 100.

Further, the driving transistor 10 further includes an active layer 14 located under the gate 13, but this application is not limited to this. When a bottom gate structure is adopted in the present application, the active layer 14 may also be located above the gate 13. In this application, "the active layer 14 is located under the gate 13" is taken as an example for description. The active layer 14 includes a channel region 141 and a doped region, and a portion of the active layer 14 corresponding to the channel region 141 overlaps the gate 13 in a vertical direction, and the portion of the active layer 14 corresponding to the doped region is connected to the source wiring 11 and the drain wiring 12.

Specifically, the channel region 141 of the active layer 14 is disposed opposite to the gate 13, and certainly, the coverage area of the gate 13 may also be slightly larger than the coverage area of the channel region 141. The doped region includes a source doped region 142 and a drain doped region 143 respectively located on both sides of the channel region 141. The portion where the source wiring 11 is connected to the source doped region 142 forms a source 113 of the driving transistor 10, and the portion where the drain wiring 12 is connected to the drain doped region 143 forms a drain 123 of the driving transistor 10.

Optionally, the material of the active layer 14 includes wide-bandgap semiconductor materials such as silicon carbide (SiC) and gallium nitride (GaN). The wide-bandgap semiconductor materials such as silicon carbide and gallium nitride are light-transmissive and are not affected by visible light irradiation. Therefore, the channel region 141 corresponding to the active layer 14 does not need to be provided with a light-shielding layer, so the active layer 14 will not affect the light transmittance of the light-transmitting region LD.

Please continue to refer to FIG. 5. The driving transistor 10 is disposed on the first substrate 20, and insulating layers are provided between the layer where the data signal line DL of the driving transistor 10 is located, the layer where the gate 13 is located, and the layer where the active layer 14 is located. For example, a gate insulating layer 15 and an interlayer insulating layer 16, and the like.

Specifically, the first substrate 20 may be a rigid substrate or a flexible substrate. When the first substrate 20 is a rigid substrate, it may include a rigid substrate such as a glass substrate. When the first substrate 20 is a flexible substrate, it may include a flexible substrate such as a polyimide (PI) film, an ultra-thin glass film, or the like.

Optionally, a buffer layer 30 is further provided between the first substrate 20 and the driving transistor 10. The buffer layer 30 can prevent undesirable impurities or contaminants (such as moisture, oxygen, etc.) from diffusing from the first substrate 20 into the devices that may be damaged by these impurities or contaminants, and can also provide a flat top surface.

The active layer 14 of the driving transistor 10 is disposed on the buffer layer 30. The gate insulating layer 15 covers the active layer 14 and the buffer layer 30. The gate 13 and the gate scan line SL are disposed in the same layer, and the gate 13 and the gate scan line SL are both located on the gate insulating layer 15, wherein the gate 13 is disposed opposite to the channel region 141 of the active layer 14.

The interlayer insulating layer 16 covers the gate 13 and the gate scan line SL. The data signal line DL, the source 113, and the drain 123 are arranged in the same layer, and the data signal line DL is located on the interlayer insulating layer 16. The source 113 and drain 123 are connected to the doped region of the active layer 14 through the via holes of the interlayer insulating layer 16 and the gate insulating layer 15.

It should be noted that the "arranged in the same layer" in this application means that in the manufacturing process, the film layer formed of the same material is patterned to obtain at least two different features, and the at least two different features are in the same layer. For example, in this embodiment, the gate 13 and the gate scan line SL are obtained by patterning the same conductive film layer, and the gate 13 and the gate scan line SL are disposed in the same layer.

Optionally, a planarization layer 17 may be further provided on the side of the driving transistor 10 away from the first substrate 20. The planarization layer 17 covers the data signal line DL, the source 113, and the drain 123, etc. to provide a flat top surface.

In this embodiment, the driving transistor 10 of the sub-pixel unit 100 is designed in a harpoon shape, so that at least part of the source wiring 11 of the driving transistor 10 is disposed at the boundary region of the sub-pixel unit 100 and parallel to the extension direction of the data signal line DL. The drain wiring 12 is disposed in the light-transmitting region LD of the sub-pixel unit 100 and coincides with the centerline B of the light-transmitting region LD. The boundary region of the sub-pixel unit 100 is not used for display, so designing the source wiring 11 of the driving transistor 10 at the boundary region does not affect the display of the sub-pixel unit 100. Furthermore, it is not necessary to provide a separate driving transistor disposing region, so that an area of the light-transmitting region of the pixel unit 100 occupied by driving transistor 10 is reduced, the area of the light-transmitting region of the pixel unit 100 is increased, and an aperture ratio of a backplane of a display product is improved.

Figure 6:
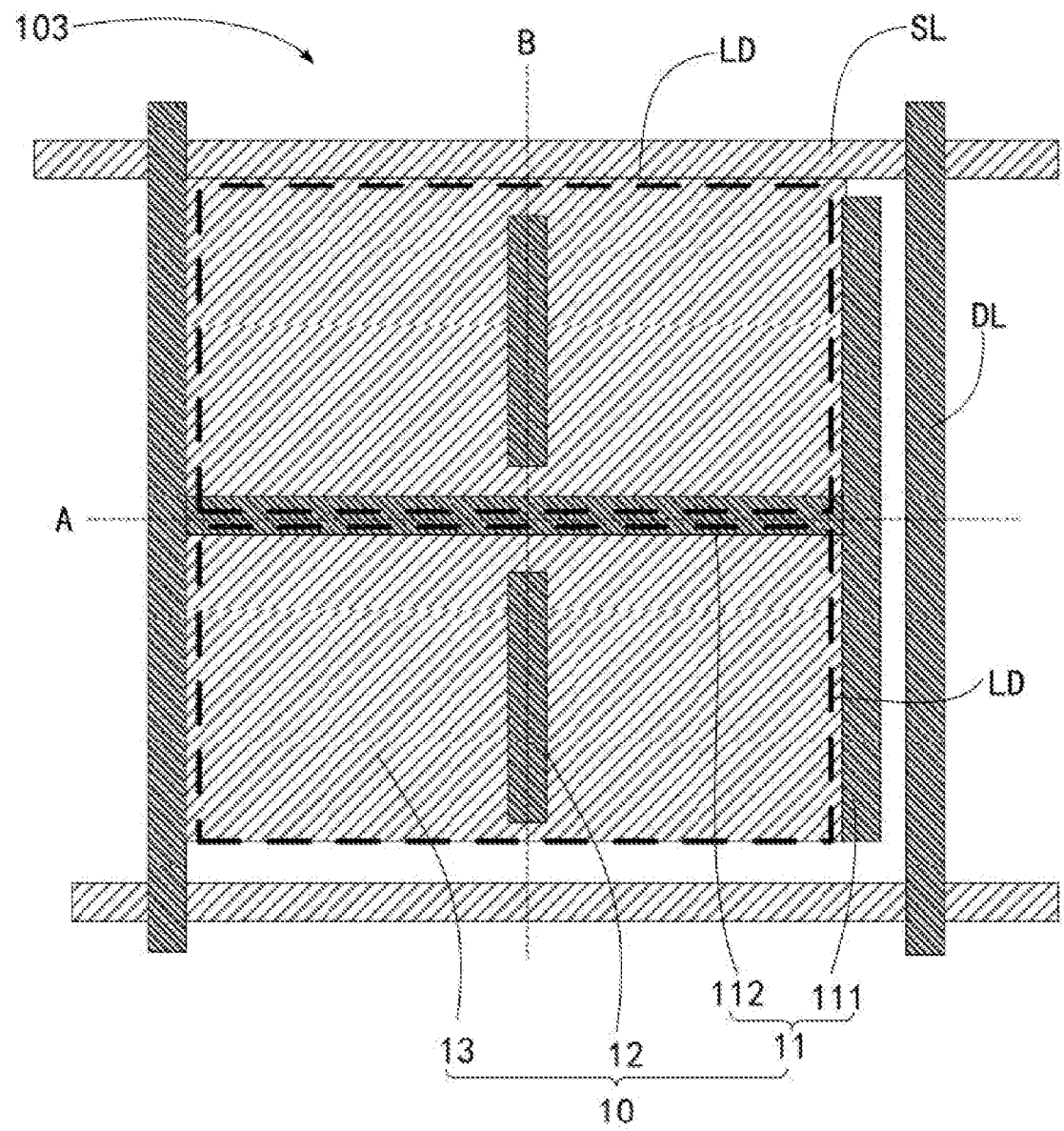
FIG. 6 is a schematic diagram of still another top view structure of a sub-pixel unit provided by an embodiment of the application.

In one embodiment, please refer to FIG. 6, which is a schematic diagram of still another top view structure of the sub-pixel unit provided by an embodiment of the application. Different from the above-mentioned embodiment, the source wiring 11 of the driving transistor 10 in the sub-pixel unit 103 includes a first sub-source line 111 and a second sub-source line 112. The first sub-source line 111 is disposed at the boundary of the light-transmitting region LD and is parallel to the extending direction of the data signal line DL. One end of the second sub-source line 112 is connected to the first sub-source line 111, and the other end of the second sub-source line 112 is connected to the data signal line DL away from the first sub-source line 111. The data signal line DL far away from the first sub-source line 111 refers to the data signal line DL located at the boundary of the light-transmitting region LD and relatively far from the first sub-source line 111.

Specifically, the second sub-source line 112 connects the data signal line DL and the first sub-source line 111. That is, the first sub-source line 111 is connected to the data signal line DL through the second sub-source line 112.

In this embodiment, the source wiring 11 includes a first sub-source line 111 and a second sub-source line 112. In this way, one first sub-source line 111 can be reduced, so the pixel space occupied by the driving transistor can be further reduced. Therefore, the area of the light-transmitting region of the sub-pixel unit is increased, and the aperture ratio of the backplane of the display product is increased. For other descriptions, please refer to the above-mentioned embodiment, which will not be repeated here.

Optionally, the display panel of the present application includes a liquid crystal display panel and an organic light-emitting diode (OLED) display panel, etc. When the display panel is a liquid crystal display panel, the liquid crystal display panel includes pixel electrodes disposed on the driving transistors. The pixel electrode is connected to the source or drain of the driving transistor. The pixel electrode and the driving transistor are disposed on the first substrate together to form an array substrate of the liquid crystal display panel. The liquid crystal display panel further includes a color filter substrate opposite to the array substrate, and liquid crystal molecules provided between the array substrate and the color filter substrate.

Because at least part of the source wiring of the driving transistor of the liquid crystal display panel is arranged at the boundary region of the light-transmitting region of the sub-pixel unit and is parallel to the extending direction of the data signal line, the drain wiring of the driving transistor is disposed in the light-transmitting region of the sub-pixel unit. Correspondingly, the gate and the active layer of the driving transistor are also arranged corresponding to the light-transmitting region, and the gate and the active layer are both made of light-transmitting materials. In this way, it is not necessary to separately provide an opaque driving transistor region in the sub-pixel unit, so that the area of the light-transmitting region occupied by the driving transistor in the sub-pixel unit is reduced, thereby increasing the area of the light-transmitting region of the sub-pixel unit, and improving the aperture ratio of the liquid crystal display panel. Therefore, the area of the light-transmitting region of the sub-pixel unit is increased, and the aperture ratio of the liquid crystal display panel is improved.

Optionally, when the display panel is an OLED display panel, the OLED display panel adopts bottom emission, and the OLED display panel includes a light-emitting functional layer disposed on the driving transistors and an encapsulation layer disposed on the light-emitting functional layer.

Specifically, the light-emitting functional layer includes a pixel electrode, a pixel defining layer, a luminescent material layer, and a cathode layer. The pixel electrode is connected to the source or drain of the driving transistor. The pixel defining layer covers the pixel electrode and the driving transistor, and the pixel defining layer is patterned to form pixel openings. The pixel opening exposes a part of the pixel electrode to define a disposing region of the luminescent material. The luminescent material layer is formed of light-emitting material printed in the pixel opening of the pixel defining layer, and the cathode layer covers the luminescent material layer and the pixel defining layer. The luminescent material layer emits light under the cooperative action of the pixel electrode and the cathode layer, thereby realizing the pixel display of the OLED display panel.

Because the OLED display panel adopts bottom emission, in order to improve the utilization of light, the pixel electrode adopts a transparent electrode. For example, the pixel electrode may be formed of indium tin oxide (ITO), indium zinc oxide (IZO), ZnO, or $In_2O_3$. The cathode layer adopts a reflective electrode, which may be formed from metals with low work functions such as Li, Ca, LiF/Ca, LiF/Al, Al, Ag, or Mg.

Optionally, the light-emitting functional layer may further include a hole injection layer (HIL) and a hole transport layer (HTL) disposed between the luminescent material layer and the pixel electrode and an electron injection layer (EIL) and an electron transport layer (ETL) disposed between the luminescent material layer and the cathode layer.

Optionally, the encapsulation layer may adopt a thin-film encapsulation layer. The thin-film encapsulation layer may be a laminated structure formed by sequentially stacking three thin film layers of a first inorganic encapsulating layer, an organic encapsulating layer, and a second inorganic encapsulating layer, or a laminated structure of more film layers, which is used to protect the luminescent material layer in the light-emitting functional layer to prevent water and oxygen from intruding and causing the luminescent material layer to fail.

Similarly, because at least part of the source wiring of the driving transistor of the OLED display panel is arranged at the boundary region of the sub-pixel unit and is parallel to the extending direction of the data signal line, the drain wiring of the driving transistor is arranged in the light-transmitting region of the sub-pixel unit. Correspondingly, the gate and the active layer of the driving transistor are also arranged corresponding to the light-transmitting region, and the gate and the active layer are both made of light-transmitting materials. In this way, it is not necessary to separately provide an opaque driving transistor region in the sub-pixel unit, the driving transistor region can be defined under the light-emitting unit, which allows a larger pixel opening and improves the aperture ratio of the OLED display panel. Furthermore, the light-transmitting driving transistor will help increase the amount of light transmitted to the functional elements under the OLED screen. The functional element can be a camera, a fingerprint recognition sensor, or the like.

An embodiment of the present application further provides a display device, which includes the display panel in the foregoing embodiments, a circuit board and other components bonded to the display panel, a cover plate covering the display panel, and the like.

As described in the above embodiments, this present application provides a display panel and a display device. In the display panel, the gate scan lines extending in the first direction and the data signal lines extending in the second direction intersect to define a plurality of sub-pixel units. At least one driving transistor is provided in the light-transmitting region of the sub-pixel unit, and the driving transistor includes a source wiring and a drain wiring. At least part of the source wiring of the driving transistor is disposed at the boundary of the light-transmitting region and parallel to the extending direction of the data signal line, and the drain wiring is disposed at the light-transmitting region so that the entire driving transistor is designed in a harpoon shape. The boundary region of the sub-pixel unit is not used for display, so designing the source wiring of the driving transistor at the boundary region will not affect the display of the sub-pixel unit. Furthermore, there is no need to provide a separate driving transistor arrangement region, which reduces the area of the light-transmitting region of the pixel unit occupied by the driving transistor, increases the area of the light-transmitting region of the pixel unit, and further improves aperture ratio of the backplane of the display product.

In the foregoing embodiments, the description of each embodiment has its own focus. For parts that are not described in detail in a certain embodiment, reference may be made to related descriptions of other embodiments.

The embodiments of the application are described in detail above, and specific examples are used in this article to illustrate the principle and implementation of the present application. The description of the above embodiment is only used to help understand the method and core idea of this application. Those of ordinary skill in the art should understand that they can still modify the technical solutions described in the foregoing embodiments, or equivalently replace some of the technical features. However, these modifications or replacements do not cause the essence of the corresponding technical solutions to deviate from the scope of the technical solutions of the embodiments of the present application.

What is claimed is:

1. A display panel, comprising:
gate scan lines extending along a first direction; and
data signal lines extending along a second direction, wherein the data signal lines intersect the gate scan lines to define a plurality of sub-pixel units, each of the sub-pixel units comprises at least one light-transmitting region, each of the at least one light-transmitting regions is provided with at least one driving transistor, and the driving transistor comprises a source wiring and a drain wiring; and
wherein at least part of the source wiring of the driving transistor is disposed at a boundary of the at least one light-transmitting region and parallel to an extension direction of the data signal lines, and the drain wiring is disposed in the at least one light-transmitting region,
wherein the drain wiring is parallel to the second direction, and the drain wiring coincides with a centerline of the at least one light-transmitting region,
wherein the source wiring comprises two first sub-source lines disposed at the boundary of the at least one light-transmitting region and parallel to the extension direction of the data signal lines and a second sub-source line connecting the two first sub-source lines, and wherein the two first sub-source lines are symmetrical with respect to the drain wiring.

2. The display panel according to claim 1, wherein the second sub-source line is parallel to the first direction, and the second sub-source line coincides with a dividing line of two adjacent light-transmitting regions.

3. The display panel according to claim 1, wherein one of the two first sub-source lines is electrically connected to an adjacent data signal line.

4. The display panel according to claim 3, wherein an interval between the first sub-source line and the adjacent data signal line is less than or equal to 1.5 micrometers.

5. The display panel according to claim 1, wherein the source wiring comprises a first sub-source line and a second sub-source line, the first sub-source line is disposed at the boundary of the at least one light-transmitting region and parallel to the extension direction of the data signal lines, one end of the second sub-source line is connected to the first sub-source line, and another end of the second sub-source line is connected to one of the data signal lines away from the first sub-source line.

6. The display panel according to claim 1, wherein a line width of the source wiring and/or the drain wiring is greater than or equal to 1.5 micrometers.

7. The display panel according to claim 1, wherein the driving transistor further comprises a gate disposed on a same layer as the gate scan lines and connected to one of the gate scan lines, and the gate corresponds to the at least one light-transmitting region.

8. The display panel according to claim 7, wherein a material of the gate comprises indium tin oxide.

9. The display panel according to claim 7, wherein the driving transistor further comprises an active layer disposed apart from the gate.

10. The display panel according to claim 9, wherein the active layer comprises a channel region and doped regions, a portion of the active layer corresponding to the channel region overlaps the gate in a vertical direction, and portions of the active layer corresponding to the doped regions are connected to the source wiring and the drain wiring.

11. The display panel according to claim 10, wherein a material of the active layer comprises silicon carbide and gallium nitride.

12. A display device comprising a display panel, wherein the display panel comprises:
gate scan lines extending along a first direction; and
data signal lines extending along a second direction, wherein the data signal lines intersect the gate scan lines to define a plurality of sub-pixel units, each of the sub-pixel units comprises at least one light-transmitting region, each of the at least one light-transmitting regions is provided with at least one driving transistor, and the driving transistor comprises a source wiring and a drain wiring; and wherein at least part of the source wiring of the driving transistor is disposed at a boundary of the at least one light-transmitting region and parallel to an extension direction of the data signal lines, and the drain wiring is disposed in the at least one light-transmitting region, wherein the drain wiring is parallel to the second direction, and the drain wiring coincides with a centerline of the at least one light-transmitting region, wherein the source wiring comprises two first sub-source lines disposed at the boundary of the at least one light-transmitting region and parallel to the extension direction of the data signal lines and a second sub-source line connecting the two first sub-source lines, and wherein the two first sub-source lines are symmetrical with respect to the drain wiring.

13. The display device according to claim 12, wherein the second sub-source line is parallel to the first direction, and the second sub-source line coincides with a dividing line of two adjacent light-transmitting regions.

14. The display device according to claim 12, wherein one of the two first sub-source lines is electrically connected to an adjacent data signal line.

15. The display device according to claim 14, wherein an interval between the first sub-source line and the adjacent data signal line is less than or equal to 1.5 micrometers.

16. The display device according to claim 12, wherein the source wiring comprises a first sub-source line and a second sub-source line, the first sub-source line is disposed at the boundary of the at least one light-transmitting region and parallel to the extension direction of the data signal lines, one end of the second sub-source line is connected to the first sub-source line, and another end of the second sub-source line is connected to one of the data signal lines away from the first sub-source line.

* * * * *